United States Patent [19]

Sanger

[11] Patent Number: 5,266,973

[45] Date of Patent: Nov. 30, 1993

[54] METHODS FOR MEASURING LASER PERFORMANCE IN LASER PRINTERS

[75] Inventor: Kurt M. Sanger, Rochester, N.Y.

[73] Assignee: Eastman Kodak Company, Rochester, N.Y.

[21] Appl. No.: 749,058

[22] Filed: Aug. 23, 1991

[51] Int. Cl.⁵ .............................................. G01D 9/42
[52] U.S. Cl. ....................................... 346/108; 356/72
[58] Field of Search ................... 346/108, 107 R, 160, 346/76 L; 356/72

[56] References Cited

U.S. PATENT DOCUMENTS 4,757,327  7/1988  Henzi ............................... 346/107 R
5,050,156  9/1991  Barton .............................. 346/76 L

*Primary Examiner*—A. T. Grimley
*Assistant Examiner*—Nestor R. Ramirez
*Attorney, Agent, or Firm*—Robert L. Randall

[57] ABSTRACT

A method is disclosed for measuring the performance of individual lasers in a multiple channel laser printer. A laser is first preheated and then a test cycle is begun as follows. The laser is first set to a point just below but substantially equal to its threshold value and then set to a test value by supplying it with a preselected current pulse within its operating range. The power output of the laser is then read a substantial number of times and the average value of the readings of laser power output is recorded. The test cycle is repeated for a substantial number of different test values with respectively different preselected current pulses within the laser's operating range.

22 Claims, 1 Drawing Sheet

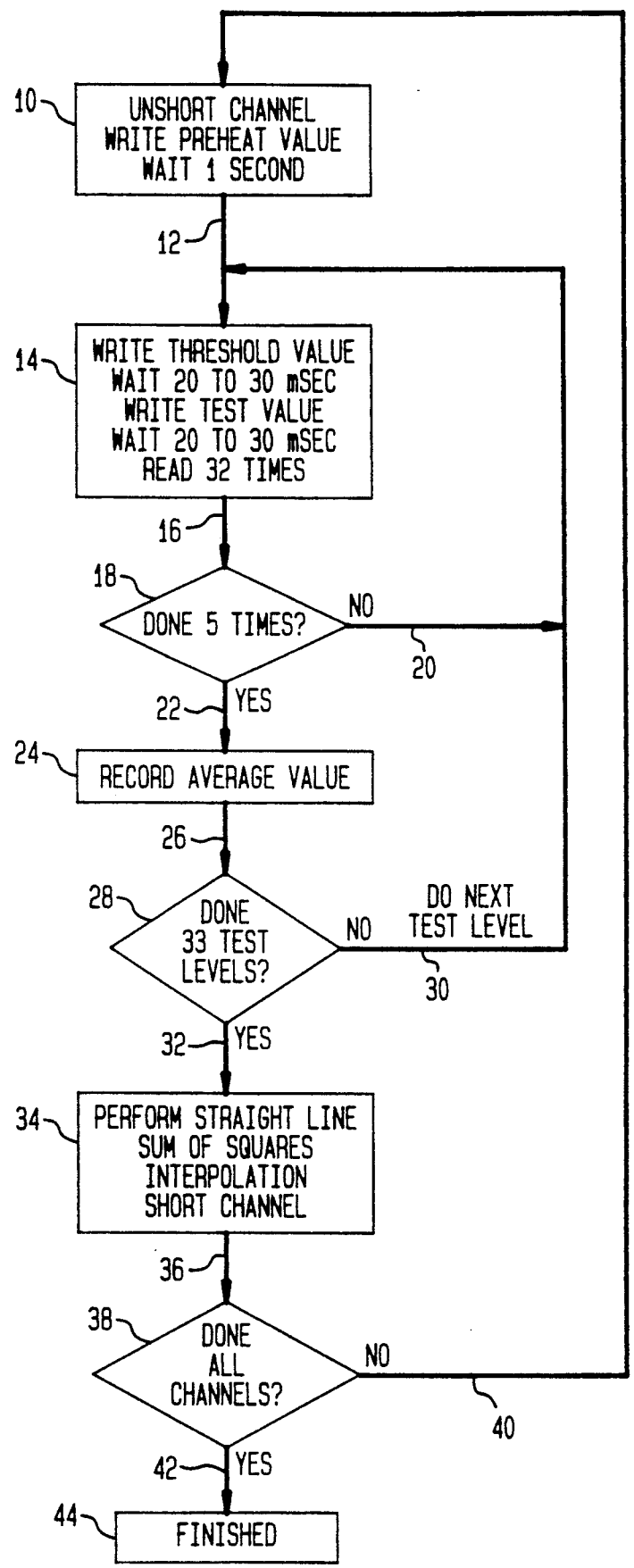

METHODS FOR MEASURING LASER PERFORMANCE IN LASER PRINTERS

CROSS-REFERENCE TO RELATED APPLICATIONS

Reference is made to U.S. patent application Ser. No. 749,031, entitled "A Method of Calibrating a Multichannel Printer," and filed concurrently with the present application in the name of Sanger et al. This application, which is incorporated herein by reference, is assigned to the assignee of the present invention.

FIELD OF THE INVENTION

This invention relates generally to methods for measuring the performance of lasers in laser printers and more particularly, although in its broader aspects not exclusively, to methods for measuring the performance of individual lasers in multiple channel laser printers.

BACKGROUND OF THE INVENTION

In one type of laser printer, a photosensitive material is supported on a rotatable drum, and a print head carrying a light source (e.g., a laser) is advanced relative to the photosensitive material by means of a lead screw. The light source is modulated in accordance with an information signal to form an image on the photosensitive material. In order to increase the output of such apparatus, multiple light sources (e.g., lasers) are mounted in the print head to form multiple channels so that a plurality of print lines can be formed in a single pass. In multiline scanning systems, any difference of densities among the lines can create very severe artifacts in the image. These artifacts can appear as repetitive patterns known as "banding."

The problem of banding can be particularly troublesome in half-tone printing where, for example, 12 minipixels are used to write a half-tone dot. Visible lines in the image, caused by unevenness in the densities of the lines, can come at a different section of each successive half-tone dot, and thus cycle across the image. The visible lines can be due, for example, to a variation in the intensity of the light sources (e.g., the lasers). The frequency of the visible lines in the image beats with the half-tone dot frequency. The resulting macro density variation can have a spatial frequency in the image which, unfortunately, matches the frequency at which the human eye is most sensitive, that is, at about 0.5 cycle/mm. At this frequency range, the typical human eye can see a variation of density of around 0.2 percent. This small level of unevenness in density is difficult to control in a printer using a multiline print head.

Laser power measurements are used in a multichannel printer like the one disclosed in the above mentioned U. S. Patent Application to track individual laser performance over time. Individual laser currents can then be adjusted to maintain constant power levels, which produce equal amounts of print density within one swath. A swath is created by the number of writing lines printed during one revolution of the drum. Without such adjustments, the differences in output among the several channels of the printer would eventually produce unacceptable results. The imbalance within the swath would, in other words, produce visible artifacts and the resulting print would become unusable.

In the past, laser performance measurements have been made by positioning the print head in front of an integrating sphere. A silicon sensor mounted in the integrating sphere was amplified and the output signal sent to an analog to digital converter. The power for each channel was then recorded at as many as 33 different settings. During each of these settings the laser was turned on for 3 seconds. Over 100 readings were measured, and the difference between the average value and the value with no laser on was saved. A spline curve was fit to the resulting set of 33 readings for each channel.

This earlier method tended to produce an undesirable amount of variability from one calibration run to the next. A number of problems have been observed. When the laser is used to sublimate dye it is not normally turned on at a 100 percent duty cycle. Differences between pulsed and continuous operation may be large enough to account for some of the discrepancies between measured power and resultant density. In addition, laser output tended to vary as a function of temperature. Using a linearly incrementing list of test levels increases the local temperature of the laser and the calibration sensor during the time of the test. As a result, the results are biased and a hysteresis effect is introduced. A spline curve fit also tends to follow the results too closely. The individual data points can appear to contain step discrepancies which may not always occur in the same place but, rather, are a function of the history of how the laser was operated. This latter effect appears to be due to the different rates of heat generation and dissipation within the laser package. A spline curve fit tends also to be sensitive to intermittent noise during the calibration process. For all of these reasons, a better way of measuring laser performance would clearly be beneficial.

SUMMARY OF THE INVENTION

The present invention permits the performance of one or more lasers in a laser printer to be measured with both increased accuracy and increased consistency (i.e., repeatability). In accordance with the invention, the performance of a laser in a laser printer is measured in substantially the same environment in which it is operated during the printing process. Broadly, a test cycle is formed by turning the laser on and setting it to a test value by supplying it with a preselected amount of current within its operating range, reading the power output of the laser at least once at the test value set, recording the average value of the readings of laser power output, and turning the laser off. The laser is thus effectively pulsed for each set of readings, creating an environment substantially the same as that in which it operates during the printing process. The test cycle is repeated for a multiplicity of different test values with respectively different preselected amounts of current within the laser's operating range. More specifically, in a number of important applications of the invention, the laser is first preheated by supplying it with a first predetermined amount of current and the test cycle is begun by setting the laser to a point just below but substantially equal to its threshold value (i.e., the point at which it begins to lase) by supplying it with a second predetermined amount of current.

In accordance with one important aspect of the invention, successive test values within each test cycle shift between substantially different levels of the laser's operating current range, e.g., between respective high and mid levels of that range. In accordance with another aspect of the invention, the rate at which the laser is set to successive test values is substantially equal to the normal operating rate of the laser in the laser printer. In at least one specific application of the invention, the power output of the laser is read 32 times at each test value set, the test cycle is performed 5 times, and readings are obtained for 33 different test levels.

In applications of the present invention, lasers are pulsed during the measurement process to represent more closely the power level expected while image data is being printed. Further, the test levels shift between high and middle power levels to distribute heating effects evenly during the test. In many specific applications, only the upper half of the power level range is tested, as this is the normal operating range. Still further, the lasers are turned on at a median level for one second just prior to performing the test in order to preheat the device. Next, multiple numbers of repetitions are performed for each test level to decrease susceptibility to noise. Finally, a simple linear curve fit is performed on the averaged samples to show individual channel performance. As a result, the current supplied to the laser during operation of the laser printer can readily be adjusted to reflect any adverse performance changes detected by the measurement process.

Although the invention is applicable to single channel laser printers as well, it is particularly advantageous when used in connection with multiple channel laser printers. In such applications the test cycle is repeated for each of the lasers in sequence. This permits not only adjustment of each of the lasers individually but also adjustment of each in relation to the others.

The invention will be better understood from the following detailed description of a specific application, taken in the light of the accompanying drawing and the appended claims.

BRIEF DESCRIPTION OF THE DRAWING

The single FIGURE of the drawing is a flow chart illustrating detailed operation of the invention in the context of a multiple channel laser printer.

DETAILED DESCRIPTION

The single FIGURE of the drawing illustrates a specific process for measuring laser performance in a multiple channel laser printer in accordance with the invention. The process is performed with the aid of computer techniques well known in the art and begins with a box 10, which includes the initial step of unshorting a channel (i.e., a laser) to turn it on and the subsequent step of supplying (i.e., writing) a medium level current pulse to preheat the laser. A medium level current pulse is one somewhere in the middle level of the laser's operating range. At that point, the process waits one second to permit preheating to take place before moving on through a path 12 to a following box 14. Preheating has the advantage of reducing the number of later test measurements needed to ensure accurate results.

Box 14 contains several steps, the first of which is to supply (i.e., write) the laser with the current pulse needed to set it just below its threshold. The threshold for a laser is that current level at which the laser diode begins to lase (i.e., act like a laser by emitting coherent light). Below that level, the diode may act only as a light emitting diode and does not sublimate dye in a laser printer. The laser is set to a point just below its threshold value for 20 to 30 milliseconds and then set to a test value for 20 to 30 milliseconds. While the laser is set at its test value, 32 separate readings of laser power output are obtained.

Upon completion of the complete set of 32 readings, the process moves on through a path 16 to a box 18, where a count is kept of the number of times the complete set of steps in box 14 have been performed. Until the count has reached 5, the box 18 comparison yields a "no" answer and the process loops back through a path 20 to reinitiate the set of steps contained in box 14. After the count has reached 5, the box 18 comparison yields a "yes" answer and the process proceeds through a path 22 to a box 24. At that point, the average value of the 160 readings (5 times 32) is recorded.

After the step contained in box 24 has been completed, the process moves through a path 26 to a box 28, where another count is maintained. The steps included in boxes 14, 18, and 24 (along with paths 16, 20, 22, and 26) constitute a complete test cycle specific to a test level. Box 28 checks to see if the cycle has been completed 33 times for different test levels. The different test levels used in a specific example are shown in the following table, where Sequence Number represents the order in which the levels are selected and DAC Value represents a number which controls a digital to analog converter (DAC). The output of the digital to analog converter (not shown) may be amplified, using techniques well known in the art, and used to supply current to the laser. Typically, a separate laser diode, digital to analog converter, and amplifier may be used for each printer channel. The DAC Value may, if desired, represent a different power level for different channels.

| Sequence Number | DAC Value |
| --- | --- |
| 1 | 2000 |
| 2 | 4000 |
| 3 | 2126 |
| 4 | 4000 |
| 5 | 2252 |
| 6 | 2315 |
| 7 | 2378 |
| 8 | 3575 |
| 9 | 2504 |
| 10 | 2567 |
| 11 | 3953 |
| 12 | 2693 |
| 13 | 3827 |
| 14 | 2819 |
| 15 | 3953 |
| 16 | 2945 |
| 17 | 3008 |
| 18 | 3827 |
| 19 | 3134 |
| 20 | 2189 |
| 21 | 3260 |
| 22 | 2200 |
| 23 | 3386 |
| 24 | 2100 |
| 25 | 3512 |
| 26 | 2441 |
| 27 | 3638 |
| 28 | 3701 |
| 29 | 3764 |
| 30 | 2000 |
| 31 | 3890 |
| 32 | 2000 |
| 33 | 4000 |

In the above table, DAC Values of 0 through 4000 represent the entire operating range of an individual laser, with 0 representing the lowest current pulse level and 4000 the highest. In the example shown, DAC Values in the 2000 to 4000 range are used exclusively, with DAC Values of from 2000 to 3000 representing the medium range and those of from 3000 to 4000 representing the high range. The test values are preferably not in a steadily increasing order but are, rather, in an order switching between high and medium levels in order to maintain a consistent average level for the duration of the test. The term "ping-pong" is a useful colloquial English expression which may be used to describe the sequence of alternating test values employed. Such a sequence is found to be advantageous in that it tends to eliminate at least some important hysteresis effects.

Until tests at all 33 test levels have been completed, box 28 yields a "no" answer. This causes the process to loop back through a path 30 to box 14. Each time the process loops back in this manner, the test level is set to the next DAC Value. In this manner, the 5 current pulses to the laser are repeated for a total of 33 test levels to characterize the channel (i.e., the laser) over the upper half of its operating range. After the count in box 28 reaches 33, a "yes" answer causes the process to move through a path 32 to a box 34, where a first step causes a straight line sum of squares interpolation to be performed between each datum point and a second step reshorts the channel (i.e., the laser) to turn it off.

After the laser is shorted by the final step in box 30, the process moves through a path 36 to a box 38. In box 38, the channels (i.e., the individual lasers) of the laser printer are counted. A multiple channel laser printer of the type to which the invention is particularly applicable may, for example, have 12 or even as many as 20 channels. Until all channels have been tested, box 38 yields a "no" answer and the process loops back through a path 40 to box 10. Box 10 then repeats the process for the next channel, unshorting it to turn it on and running through the same sequence of tests. After the last channel has been tested, the comparison in box 38 yields a "yes" answer and the process passes through a path 42 to a box 44. In box 44, the process is completed and terminates.

The process illustrated and described in connection with the single figure of the drawing has been found to be repeatable to within 0.6 percent. In other words, successive test processes applied to the same lasers in the same laser printer have been found to match one another within that amount of precision. Techniques available in the past were found to be repeatable only to within about 2.0 percent. In addition, the new process measures laser output power under conditions which much more closely approximate the manner in which the lasers are used during actual imaging. This provides the user with a vastly improved picture of the true power level on a channel by channel basis.

The illustrated process is a pulsed technique and is significantly faster than previously known processes. In the past, for example, it took approximately 3 seconds for each individual reading to take place. The new technique has been found to require only 0.3 seconds per measurement (pulsing the laser, making 32 readings, and performing the cycle 5 times) plus one second per diode for preheating. Not only is accuracy improved but considerably less time is required. For a printer with as many as 20 channels, the time saved is quite substantial.

It is to be understood that the embodiment of the invention which has been described is illustrative. Numerous other arrangements and modifications may be readily devised by those skilled in the art without departing from the spirit and scope of the invention.

What is claimed is:

1. A method of measuring the performance of a laser comprising the steps of:
    turning the laser on and setting it to a test value by supplying it with a preselected amount of current within its operating range;
    reading the power output of the laser at least twice at the test value set;
    recording the average value of the readings of laser power output
    turning the laser off; and
    repeating the steps of turning the laser on and setting it to a test value, reading the power output of the laser at least twice, recording the average value of the readings of laser power output, and turning the laser off for a multiplicity of different test values with respectively different preselected amounts of current within the laser's operating range to form a test cycle.

2. The method of claim 1 for measuring the performance of a laser in which the laser is first preheated by supplying it with a first predetermined amount of current.

3. The method of claim 2 for measuring the performance of a laser in which the test cycle includes a first step of setting the laser to a point just below but substantially equal to its threshold value by supplying it with a second predetermined amount of current.

4. The method of claim 3 for measuring the performance of a laser in which the test cycle is repeated at least once for the same multiplicity of different test values.

5. A method of measuring the performance of a laser comprising the steps of:
    preheating the laser by supplying it with a first predetermined amount of current;
    setting the laser to a point just below but substantially equal to its threshold value by supplying it with a predetermined amount of current;
    setting the laser to a test value by supplying it with a preselected amount of current within its operating range;
    reading the power output of the laser a plurality of times at the test value set;
    recording the average value of the readings of laser power output;
    repeating the steps of setting the laser near its threshold value, setting the laser to a test value, reading the power output of the laser a plurality of times, and recording the average value of the readings of laser power output for a multiplicity of different test values wit respectively different preselected amounts of current within the laser's operating range to form a test cycle; and
    repeating the test cycle a plurality of times for the laser for the same multiplicity of different test values.

6. The method of claim 5 for measuring the performance of a laser in which successive test values within each test cycle shift between substantially different levels of the laser's operating current range.

7. The method of claim 6 for measuring the performance of a laser in which successive test values within each test cycle shift between high and mid levels of the laser's operating current range.

8. The method of claim 5 for measuring the performance of a laser in which the rate at which the laser is set to successive test values is substantially equal to the normal operating rate of the laser in the laser printer.

9. The method of claim 8 for measuring the performance of a laser in which successive test values within each test cycle shift between high and mid levels of the laser's operating current range.

10. The method of claim 9 for measuring the performance of a laser in which the laser is first unshorted to turn it on in preparation for the measurements and finally reshorted to turn it off upon conclusion of the measurements.

11. The method of claim 10 for measuring the performance of a laser in which an interpolation is performed between the resulting power output readings for different test values to provide an indication of the laser's performance.

12. The method of claim 11 for measuring the performance of a laser in which the interpolation is a straight line sum of squares interpolation.

13. The method of claim 11 for measuring the performance of a laser in which the power output of the laser is read at least 32 times at each test value set, the test cycle is repeated at least 4 times, and readings are obtained for at least 33 different test levels.

14. A method of measuring the performance of a plurality of lasers comprising the steps of:
    preheating a first laser by supplying it with a first predetermined amount of current;
    setting the first laser to a point just below but substantially equal to its threshold value by supplying it with a second predetermined amount of current;
    setting the first laser to a test value by supplying it with a preselected amount of current within its operating range;
    reading the power output of the first laser a plurality of times at the test value set;
    recording the average value of the readings of laser power output;
    repeating the steps of setting the first laser near its threshold value, setting the first laser to a test value, reading the power output of the first laser a readings of laser power output for a multiplicity of different test values with respectively different preselected amounts of current within the first laser's operating range to form a test cycle;
    repeating the test cycle a plurality of times for the first laser for the same multiplicity of different test values; and
    repeating the steps of preheating and performing plural repetitions of the test cycle for the same multiplicity of different test values for each of the remaining lasers in sequence.

15. The method of claim 14 for measuring the performance of a plurality of lasers in which successive test values within each test cycle for each of the lasers shift between substantially different levels of that laser's operating current range.

16. The method of claim 15 for measuring the performance of a plurality of lasers in which successive test values within each test cycle for each of the lasers shift between high and mid levels of that laser's operating current range.

17. The method of claim 14 for measuring the performance of a plurality of lasers in which the rate at which the each laser is set to successive test values is substantially equal to the normal operating rate of that laser in the laser printer.

18. The method of claim 17 for measuring the performance of a plurality of lasers in which successive test values within each test cycle shift between high and mid levels of the respective laser's operating current range.

19. The method of claim 18 for measuring the performance of a plurality of lasers in which each laser is first unshorted to turn it on in preparation for its own set of measurements and finally reshorted to turn it off upon conclusion of its own set of measurements.

20. The method of claim 19 for measuring the performance of a plurality of lasers in which an interpolation is performed between the resulting power output readings for different test values for each of the lasers to provide an indication of performance of the respective lasers.

21. The method of claim 20 for measuring the performance of a plurality of lasers in which the interpolation is a straight line sum of squares interpolation.

22. The method of claim 20 for measuring the performance of a plurality of lasers in which the power output of each of the lasers is read at least 32 times at each test value set, the test cycle is repeated at least 4 times for each of the lasers, and readings are obtained for at least 33 different test levels for each of the lasers.

* * * * *